United States Patent
Lee (10) Patent No.: US 9,991,901 B2
(45) Date of Patent: Jun. 5, 2018

(54) METHOD OF OPTIMIZING CMOS IDAC LINEARITY PERFORMANCE USING GOLDEN RATIO

(71) Applicant: International Business Machines Corporation, Armonk, NY (US)

(72) Inventor: Sungjae Lee, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 14/844,419

(22) Filed: Sep. 3, 2015

(65) Prior Publication Data

US 2017/0201269 A1    Jul. 13, 2017

(51) Int. Cl.
*H03M 1/00* (2006.01)
*H03M 1/66* (2006.01)
*G05F 3/26* (2006.01)
*H03M 1/74* (2006.01)
*H03M 1/06* (2006.01)

(52) U.S. Cl.
CPC ............. *H03M 1/66* (2013.01); *G05F 3/262* (2013.01); *H03M 1/742* (2013.01); *H03M 1/0612* (2013.01)

(58) Field of Classification Search
CPC .......... H03M 1/66; H03M 1/747; G05F 3/262
USPC .................................. 341/136, 144
See application file for complete search history.

(56) References Cited

U.S. PATENT DOCUMENTS

| | | | |
|---|---|---|---|
| 5,568,145 A | 10/1996 | Reynolds | |
| 6,556,161 B2 | 4/2003 | Nuijten | |
| 6,603,417 B2 | 8/2003 | Greig | |
| 6,720,898 B1 | 4/2004 | Ostrem | |
| 6,954,164 B2 | 10/2005 | Lee et al. | |
| 7,227,483 B2 | 6/2007 | Seo | |
| 7,283,082 B1 | 10/2007 | Kuyel | |
| 8,421,659 B2 | 4/2013 | von Staudt | |
| 8,502,715 B2* | 8/2013 | Chen | H03M 1/1014 341/120 |
| 8,659,457 B2 | 2/2014 | Eliezer et al. | |
| 8,775,993 B2* | 7/2014 | Huang | G06F 17/5072 703/15 |
| 8,928,518 B1 | 1/2015 | Stepanovic | |
| 8,970,418 B1 | 3/2015 | Schafferer et al. | |

(Continued)

FOREIGN PATENT DOCUMENTS

WO         9016114         12/1990

OTHER PUBLICATIONS

Deveugele et al. "A Gradient-Error and Edge-Effect Tolerant Switching Scheme for a High-Accuracy DAC" IEEE Transactions on Circuits and Systems—I: Regular Papers, vol. 51, No. 1, Jan. 2004, pp. 191-195.

(Continued)

*Primary Examiner* — Jean B Jeanglaude
(74) *Attorney, Agent, or Firm* — Gibb & Riley, LLC; Steven J. Meyers, Esq.

(57) ABSTRACT

A layout method for a current source array. A digital-to-analog converter (DAC) includes a plurality of complementary metal-oxide-semiconductor (CMOS) devices. Current sources for the CMOS devices are uniformly arranged in a one-dimensional array. The spacing between the current sources in the one-dimensional array is determined using a golden ratio.

25 Claims, 11 Drawing Sheets

(56) References Cited

U.S. PATENT DOCUMENTS

| | | | | |
|---|---|---|---|---|
| 2008/0210848 A1* | 9/2008 | Purcell | ............... | H04N 5/23241 |
| | | | | 250/208.1 |
| 2010/0013560 A1* | 1/2010 | Rao | ......................... | H03F 1/301 |
| | | | | 330/296 |
| 2011/0241915 A1* | 10/2011 | Lai | ...................... | H03M 1/1061 |
| | | | | 341/120 |
| 2014/0354351 A1* | 12/2014 | Kawle | ...................... | G05F 3/262 |
| | | | | 327/581 |
| 2014/0365988 A1 | 12/2014 | Iadanza | | |
| 2015/0042498 A1 | 2/2015 | Onody et al. | | |
| 2015/0340995 A1* | 11/2015 | Story | .................... | H03F 1/0222 |
| | | | | 330/288 |

OTHER PUBLICATIONS

Irfansyah et al. "Design Strategy for Enhanced Output Impedance Current-steering DAC in Sigma-Delta Converters" School of Electrical Engineering and Telecommunications, The University of New South Wales, Australia, Perceptia Devices Australia Pty. Ltd., Australia Bioelectronics and Neuroscience Group, The MARCS Institute, University of Western Sydney, Australia, Institut Teknologi Sepuluh Nopember, Surabaya, Indonesia, 2013, pp. 289-292.

Van Den Bosch et al."A 10-bit 1-GSample/s Nyquist Current-Steering CMOS D/A Converter" IEEE Journal of Solid-State Circuits, vol. 36, No. 3, Mar. 2001, pp. 315-323.

Van Der Plas et al. "A 14-bit Intrinsic Accuracy Q2 Random Walk CMOS DAC" IEEE Journal of Solid State Circuits, vol. 34, No. 12, Dec. 1999, pp. 1708-1717.

\* cited by examiner

```
clear all;
%% golden ratio - 1
r=(1+sqrt(5))/2-1;
t=r;

%% define DAC to be optimized for DNL/INL performance
%% - specify number of bits, number of binary-weighted portion if segmented
%% - assume one column of current sources, two references nbit  = 10;  % 10bit DAC
nbin  = 5;   % 5 bits are binary-weighted
ntot  = 2^(nbit-nbin)-1 + nbin + 2;  % unary + binary + 2 references x=zeros(1,ntot);
i=1;
while (i<(ntot+1))
    n=round(ntot*t+0.5);
    if x(n)<1
        x(n)=i;
        i=i+1;
    end if t>(1-r)
        newt=t+r-1;
    else
        newt=t+r;
    end
    t=newt;
end
```

| | Min(DNL) | Max(DNL) | Min(INL) | Max(INL) | Sum(DNL) |
|---|---|---|---|---|---|
| Linear variation | -0.7454 | 0.8125 | -0.6044 | 0.6066 | -0.3355 |
| Var IV (parabolic) | -1.1773 | 0.3385 | -1.2444 | 1.0997 | -1.7465 |

Parabolic variation

Linear variation

|  | Min(DNL) | Max(DNL) | Min(INL) | Max(INL) | Sum(DNL) |
|---|---|---|---|---|---|
| Linear variation | -0.6138 | 0.9441 | -1.2160 | 0.9360 | -0.5171 |
| Var IV (parabolic) | -0.9283 | 0.5875 | -0.7460 | 0.8331 | -1.7775 |

METHOD OF OPTIMIZING CMOS IDAC LINEARITY PERFORMANCE USING GOLDEN RATIO

BACKGROUND

The present disclosure relates to digital-to-analog converters (DACs) and more particularly to placement of the current sources for the digital-to-analog converters in order to maximize linearity performance.

Digital to Analog converters (DACs) are ubiquitous in electronics where a digital signal is converted into an analog signal, e.g., for output or transmission. For example, in order to implement human-computer interfaces such as display monitors and audio outputs, computer systems employ DAC circuits, which convert digital vectors or addresses to an analog voltage or current. Digital to analog converters are used in many applications within integrated circuits (ICs) to control, tune, calibrate, or test larger and more complex systems. Some examples include audio output systems, radio frequency transmitters, temperature converters, etc. Rapid development of a digital signal processing technology results in an obvious demand for a high-speed/high-precision DACs. A high-speed DAC generally is a current source DAC, and a high precision requires good matching between unit current sources. There is a myriad of designs for DACs, and the designs may vary depending on the application and performance requirements.

In addition, the trend in microelectronics is the continued creation of smaller and smaller devices. As the devices become smaller, variations in the fringe of each shape of a device become a larger portion of the performance characteristics of the device and cause variations in the performance of a circuit dependent on the device. This is particularly important in circuits that convert from one signal domain to another, such as DACs, where precision in the conversion is required. Variation in the output signal as compared to an ideal response is known as a differential non-linearity (DNL) of the converted output signal.

SUMMARY

Linearity performance of CMOS current steering DACs strongly depends on systematic and random variations in advanced CMOS technology. Structures and methods to improve CMOS current steering DAC linearity performance (and area efficiency) by placing current sources uniformly with golden ratio. Using golden ratio to evenly place (or randomize the placement of) current sources with switches (which comprise current steering DAC, IDAC) in one dimension and optimize linearity performance. Applicable to both unary and binary (and combination thereof, i.e., segmented) DAC in any size. One-dimensional arrangement of current mirrors saves area (easy wiring) and is effective to optimize linearity performance.

According to a device, a digital-to-analog converter (DAC) comprises a plurality of complementary metal-oxide-semiconductor (CMOS) devices. Current sources for the CMOS devices are arranged in a one-dimensional array. The current sources are uniformly spaced in the one-dimensional array using a golden ratio.

According to a current source array herein, a plurality of current mirrors is arranged in a row of an array. The current mirrors are uniformly spaced in the row using a golden ratio.

According to a computer implemented method herein, attributes for a current source for digital-to-analog converters (iDAC) are defined, using a computerized device. Linearity performance constraints for the iDAC are identified, using the computerized device. Placement of the iDAC in a current source array is determined using a golden ratio, using the computerized device. Linearity performance parameters of the iDAC are calculated based on the placement, using the computerized device. The linearity performance parameters of the iDAC are compared against predefined standards, using the computerized device. Responsive to the linearity performance parameters not meeting the predefined standards, the attributes for the iDAC are modified and the linearity performance parameters of the iDAC are recalculated based on the placement, using the computerized device.

According to a layout method for a current source array, a plurality of complementary metal-oxide-semiconductor (CMOS) devices is provided. Current sources for the CMOS devices are arranged uniformly in a row of an array. The spacing between the current sources is determined using a golden ratio.

According to a computer program product for designing an integrated circuit (IC) chip, the computer program product comprises a computer readable storage medium having program instructions embodied therewith. The program instructions are readable/executable by a processor to cause the processor to perform a method. According to the method, attributes for a current source for digital-to-analog converters (iDAC) are defined. Linearity performance constraints for the iDAC are identified. Placement of the iDAC in a current source array is determined using a golden ratio. Linearity performance parameters of the iDAC are calculated based on the placement. The linearity performance parameters of the iDAC are compared against predefined standards. Responsive to the linearity performance parameters not meeting the predefined standards, the attributes for the iDAC are modified and the linearity performance parameters of the iDAC are recalculated based on the placement.

BRIEF DESCRIPTION OF THE DRAWINGS

The structures and methods herein will be better understood from the following detailed description with reference to the drawings, which are not necessarily drawn to scale and in which.

DETAILED DESCRIPTION

The disclosure will now be described with reference to a CMOS digital-to-analog converter (DAC) that has uniformly distributed current sources spaced by using the golden ratio. While the disclosure will be described hereinafter in connection with specific structures and methods thereof, it will be understood that limiting the disclosure to such specific systems and methods is not intended. On the contrary, it is intended to cover all alternatives, modifications, and equivalents as may be included within the spirit and scope of the disclosure as defined by the appended claims.

Differential nonlinearity (DNL) is a term used to describe the deviation between two analog values corresponding to adjacent input digital values. It is used for measuring error in a DAC; the accuracy of a DAC is mainly determined by this specification. Ideally, any two adjacent digital codes correspond to output analog voltages that are exactly one Least Significant Bit (LSB) apart. The DAC is said to be monotonic when a direction of a DAC output voltage changes in the same direction as the change of a digital address change, i.e., when the digital address increases, the DAC output voltage increases, and vice-versa. Differential non-linearity is a measure of the worst-case deviation from the ideal one LSB step. For example, a DAC with a 1.5 LSB output change for a one LSB digital code change exhibits ½ LSB differential non-linearity. Differential non-linearity may be expressed in fractional bits or as a percentage of full scale. A differential non-linearity greater than one LSB may lead to a non-monotonic transfer function in the DAC.

Integral nonlinearity (INL) is the maximum deviation between the ideal output of the DAC and the actual output level (after offset and gain errors have been removed). The term is often used as a specification for measuring error in the DAC. The transfer function of the DAC should ideally be a line and the INL measurement depends on the ideal line selected. Two lines often used for the INL measurement are the best fit line, which is the line that minimizes the INL result, and the endpoint line, which is a line that passes through the points on the transfer function corresponding to the lowest and highest input code. In all cases, the INL is the maximum distance between the ideal line selected and the actual transfer function.

In other words, INL is a measurement of how closely a voltage measurement at a DAC output matches predicted values at each address step, i.e., when a digital address increases by one bit. DNL is a measurement of how closely the measured voltage step between two consecutive addresses matches the ideal LSB step value computed for the DAC measured at each address step. INL and DNL values between +/−1.0 LSB are desirable.

For a general understanding of the features of the disclosure, reference is made to the drawings. In the drawings, like reference numerals have been used throughout to identify identical elements.

Figure 1:
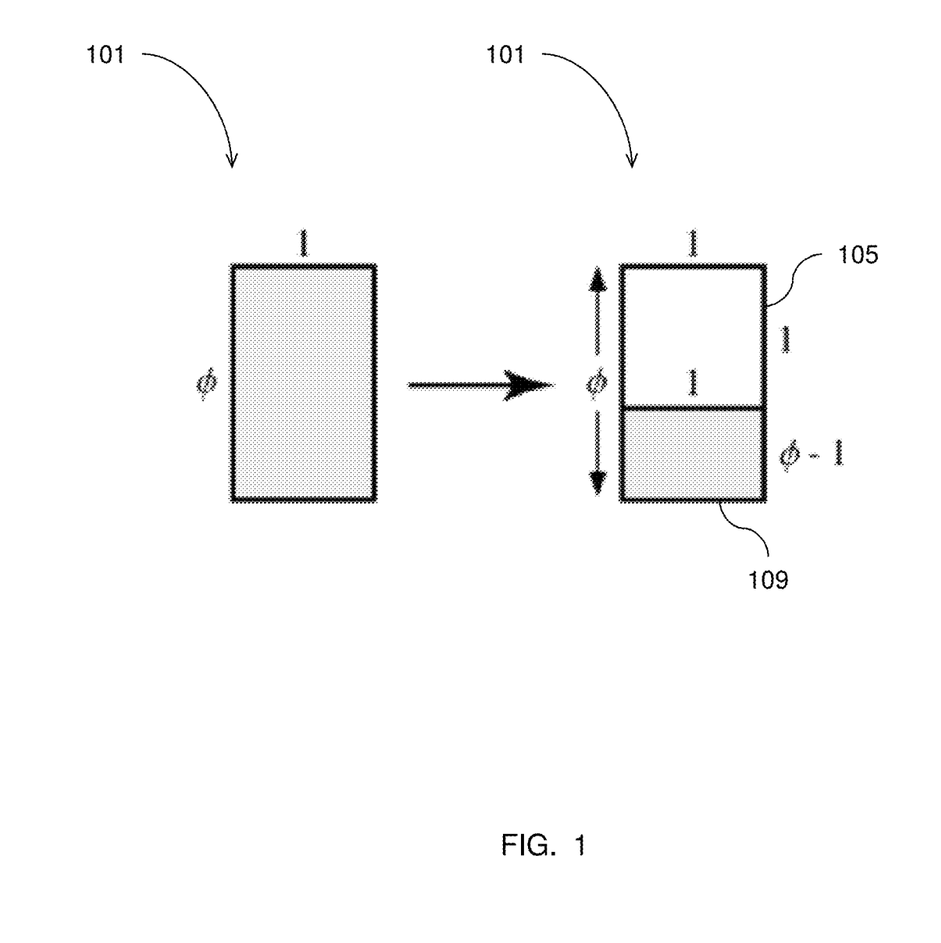
FIG. 1 is an illustration of the golden ratio according to structures and methods herein.

FIG. 1 shows the relationship of a golden ratio. Given a rectangle 101 having sides in the ratio 1:x, φ is defined as the unique number x such that partitioning the original rectangle 101 into a square 105 and new rectangle 109 results in the new rectangle 109 having sides in the ratio 1:x. The original rectangle 101 and the new rectangle 109 are similar. Such a rectangle is referred to as a golden rectangle. A distinctive feature of this shape is that when a square section is removed, the remainder is another golden rectangle; that is, with the same aspect ratio as the first. Square removal can be repeated infinitely, in which case corresponding corners of the squares form an infinite sequence of points on the golden spiral, the unique logarithmic spiral with this property. In other words, successive points dividing a golden rectangle into squares lie on a logarithmic spiral, resulting in a figure known as a whirling square.

The ratio φ is called the Golden Ratio. In mathematics, two quantities are in the golden ratio if their ratio is the same as the ratio of their sum to the larger of the two quantities. That is, expressed algebraically, for quantities a and b with a>b>0, a and b are in the golden ratio if a+b is to a as a is to b. The golden ratio has surprising connections with continued fractions and the Euclidean algorithm for computing the greatest common divisor of two integers.

Based on the above definition, it can immediately be seen in FIG. 1 that $$\frac{\phi}{1} = \frac{1}{\phi - 1}$$

which leads to $$\varphi^2 - \varphi - 1 = 0$$

Therefore, using the quadratic equation, $\varphi = \frac{1}{2}(1+\sqrt{5})$. That is, a good approximation yields $\varphi = 1.618034$.

Figure 2:
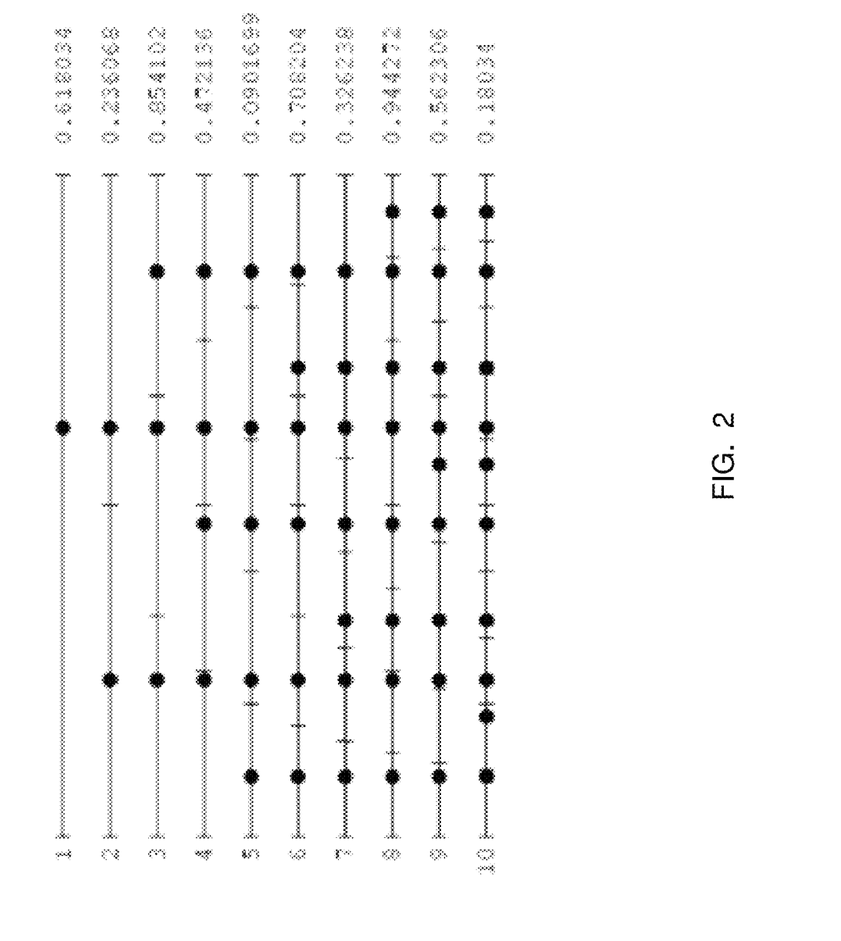
FIG. 2 is a graph of current source placement using the golden ratio according to structures and methods herein.

According to structures and methods herein, in order to improve linearity performance (and area efficiency) for CMOS current steering DACs the current sources are placed uniformly using the golden ratio. Referring to FIG. 2, a first current source may be placed at 0.618034. A second current source may be added at 0.236068. A third current source may be added at 0.854102. A fourth current source may be added at 0.472136. A fifth current source may be added at 0.0901699. Note that, as each current source is added, the other devices are uniformly distributed by the same golden ratio.

Figure 3:
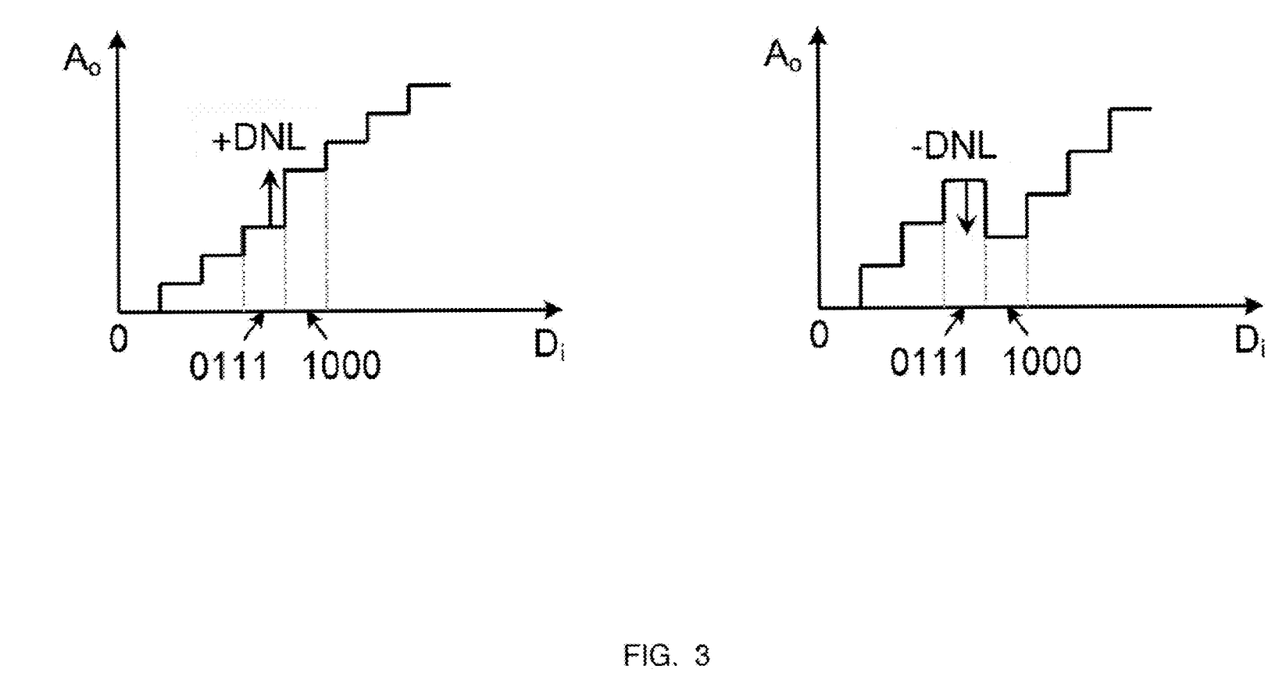
FIG. 3 is an illustration of differential non-linearity according to structures and methods herein.

As described above, linearity or nonlinearity is one of the measures of performance for a DAC. Referring to FIG. 3, if the current sources are not matched (i.e., one current source being stronger or weaker than the others), DAC output can be non-monotonic. DNL less than approximately −1 dB means the DAC is non-monotonic, which can be used as a figure of merit for the DAC.

Structures and methods herein are described herein with reference to current sources or current mirrors. As is known by one of ordinary skill in the art, a current mirror is a circuit designed to copy a current through one active device by controlling the current in another active device of a circuit, keeping the output current constant regardless of loading.

Figure 4:
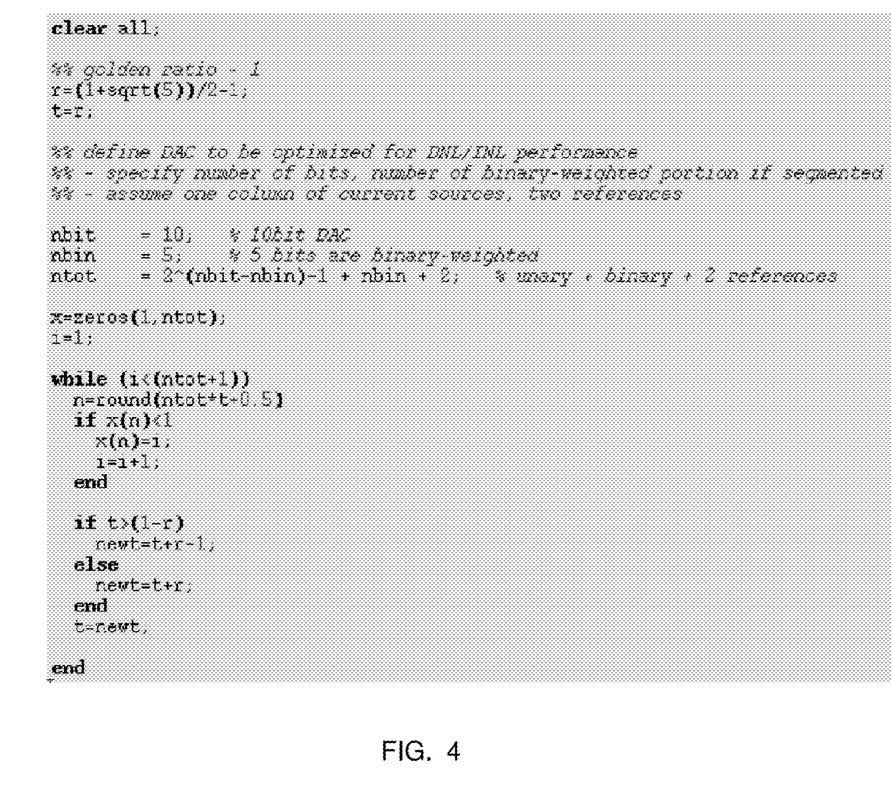
FIG. 4 is an exemplary MATLab listing according to structures and methods herein.

FIG. 4 illustrates a portion of Matlab code that can be used to determine current source placement using the golden ratio. When determining current source placement, the placement calculation can be integrated with DNL and INL performance calculations and, if desired, further optimization; e.g., weighting, segmentation, etc.

Figure 5:
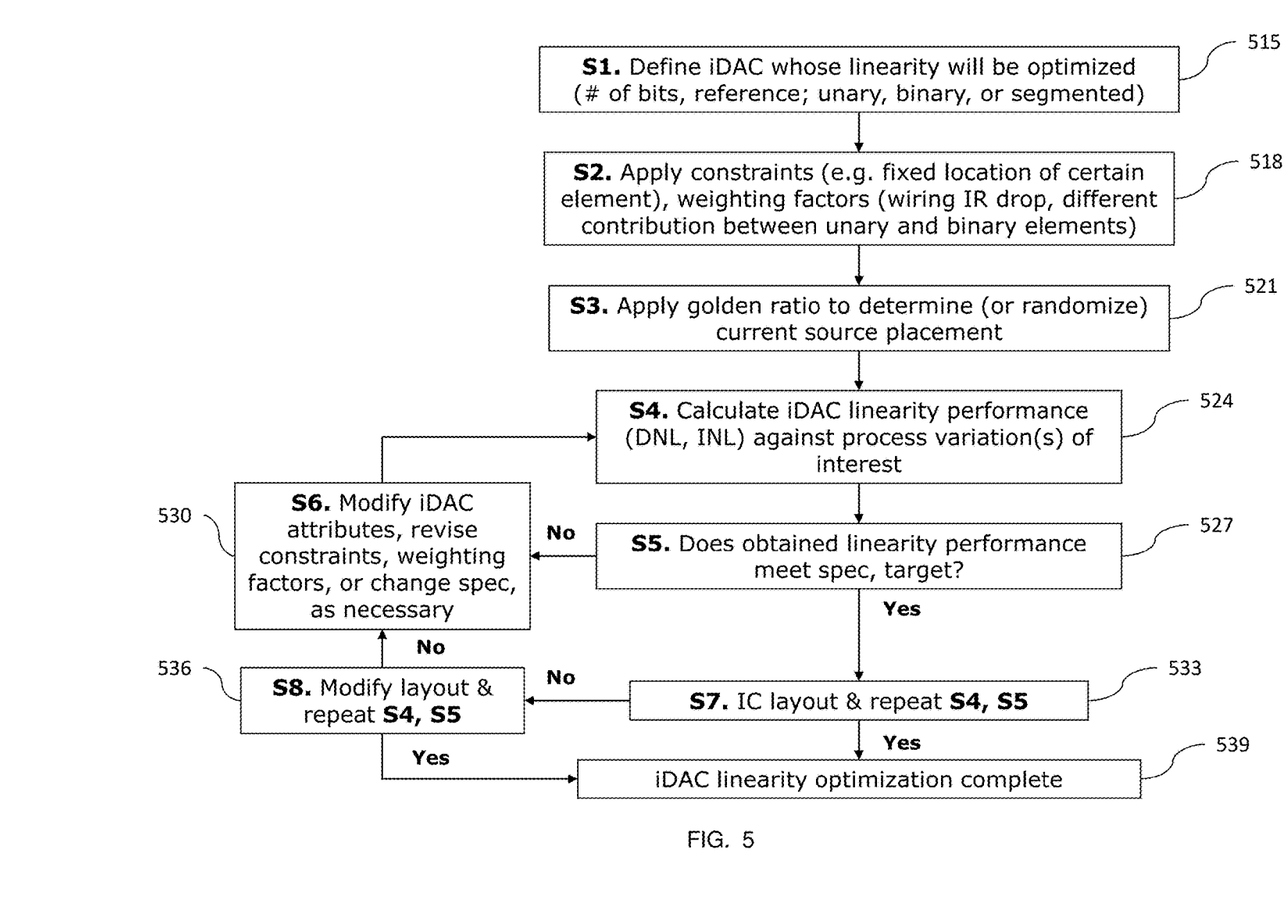
FIG. 5 is a flow diagram according to structures and methods herein.

The first process flow for iDAC Linearity Optimization is illustrated in FIG. 5. The first step (S1), as shown at 515, is to establish a definition for the iDAC on which linearity will be optimized. The iDAC is defined by the number of bits for digital conversion, whether the solution is for unary, binary, or a combination thereof (i.e., segmented). In the next step (S2), indicated at 518, any known or desired constraints may be applied. For example, certain elements may require a fixed location due to other requirements. Other constraints may include weighting factors for wiring IR drops or different contributions between unary and binary elements. In the next step (S3), indicated at 521, the golden ratio is used to determine placement of the current source. In other words, placement of the current source is optimized to overcome variation or mismatch between current sources. In the next step (S4), indicated at 524, iDAC linearity performance (DNL, INL) is calculated and compared against process variation(s) of interest. At the next step (S5), indicated at 527, a determination is made for whether the calculated linearity performance meets required performance specifications or desired target specifications. If not, at the next step (S6), indicated at 530, the iDAC attributes can be modified. That is, the constraints and/or weighting factors from S2 may be revised. Alternatively, any other specifications may be changed, as necessary. Otherwise, if the calculated linearity performance for the iDAC meets the required performance specifications, at the next step (S7), indicated at 533, the rest of the layout for the integrated circuit is determined, and the linearity performance for the iDAC is again calculated and compared to the performance specifications. Other components of the IC can influence the iDAC linearity performance due to heat, spacing, wiring, etc. If the IC layout results in the iDAC linearity performance being out of specification or desired target performance, at step S8, indicated at 536, the IC layout can be modified and the linearity performance for the iDAC is again calculated and compared to the performance specifications. Otherwise, the iDAC linearity optimization is complete, as indicated at 539.

Figure 6:
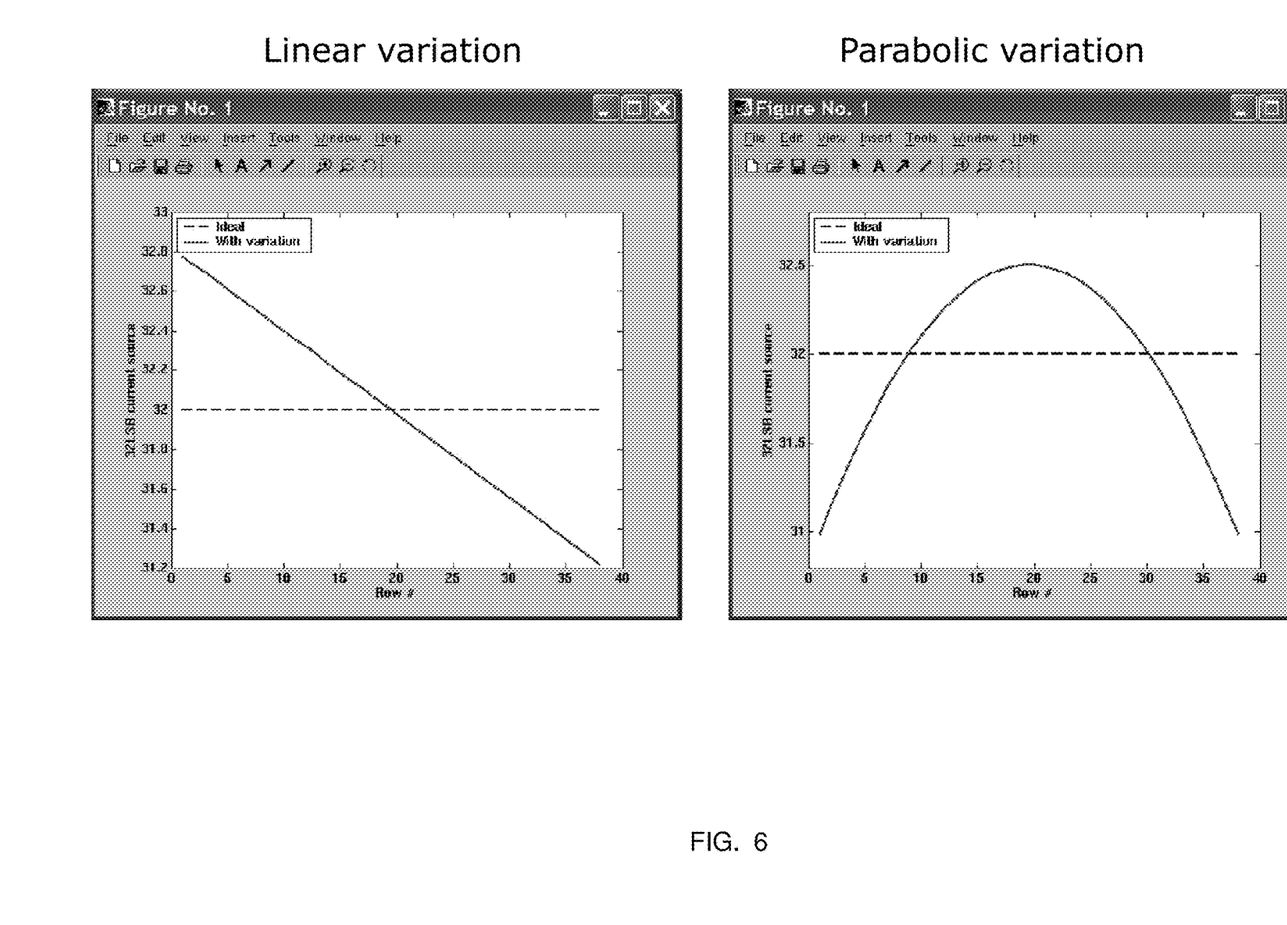
FIG. 6 illustrates test variation parameters according to structures and methods herein.

Functionality of the iDAC placement using the golden ratio can be tested by distributing current sources (reference, binary, segmented) in a one-dimensional array and measuring functional variations in the current sources. For example, in FIG. 6, the graph on the left shows a linear variation for a row of 38 pins, and the graph on the right shows a parabolic variation for the row of 38 pins. As shown, the exemplary variation is approximately 5% between the minimum and maximum nonlinearity.

Figure 7:
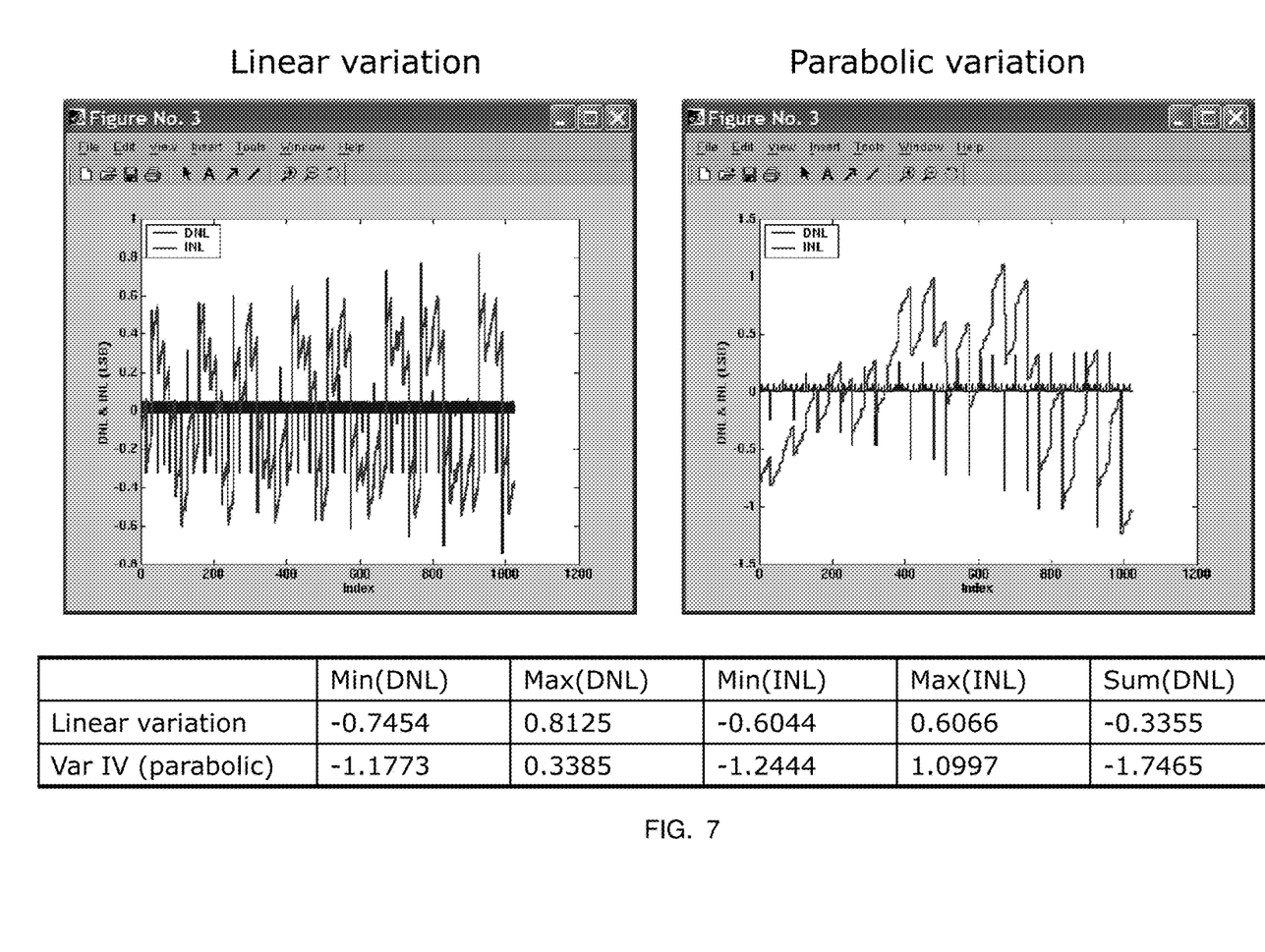
FIG. 7 illustrates test variation parameters showing non-monotonicity according to structures and methods herein.
Figure 8:
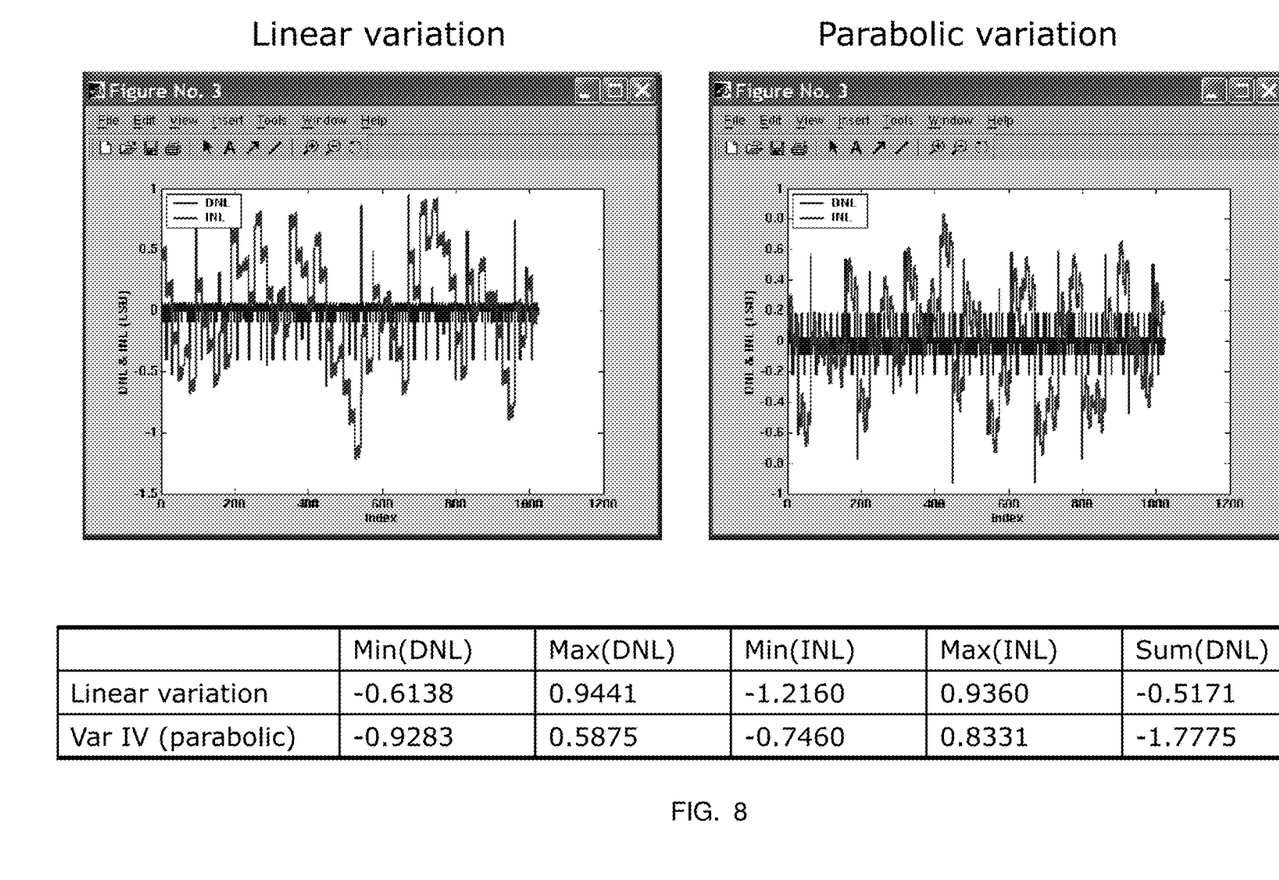
FIG. 8 illustrates test variation parameters showing monotonicity according to structures and methods herein.

FIGS. 7 and 8 show the comparison with results from "original" pin placement by an experienced analog designer to achieve the same result manually. In FIG. 7, the resulting DNL is less than −1 dB, which means the DAC is non-monotonic. In FIG. 8, the resulting DNL is greater than −1 dB, which means the DAC is monotonic.

Figure 9:
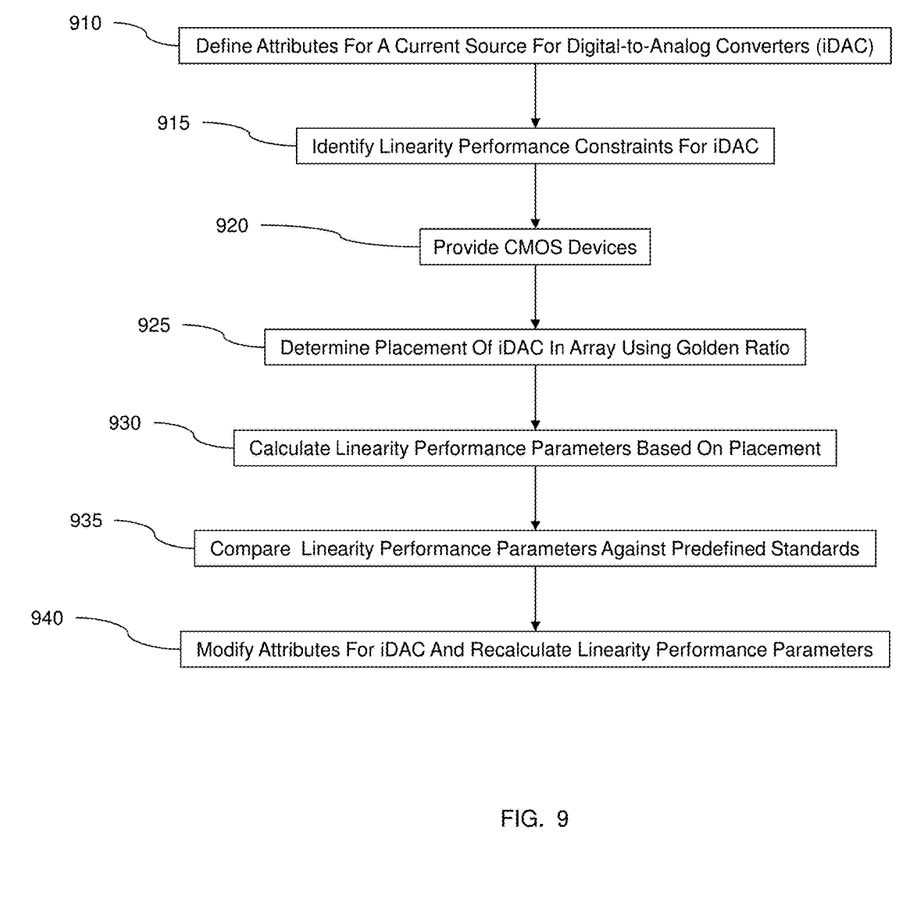
FIG. 9 is a flow diagram according to structures and methods herein.

FIG. 9 is a flow diagram illustrating the processing flow of an exemplary method of laying out a current source array according to structures and methods herein. In item 910, attributes for a current source for digital-to-analog converters (iDAC) are defined. Linearity performance constraints for the iDAC are identified, at 915. A plurality of complementary metal-oxide-semiconductor (CMOS) devices is provided, at 920. Placement of the iDAC in a one-dimensional current source array is determined using a golden ratio, at 925. Accordingly, the current sources for the CMOS devices are arranged uniformly in a row using the golden ratio. Linearity performance parameters of the iDAC are calculated based on the placement, at 930. At 935, the linearity performance parameters of the iDAC are compared against predefined standards. At 940, responsive to the linearity performance parameters not meeting the predefined standards, the attributes for the iDAC are modified and the linearity performance parameters of the iDAC are recalculated based on the placement.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
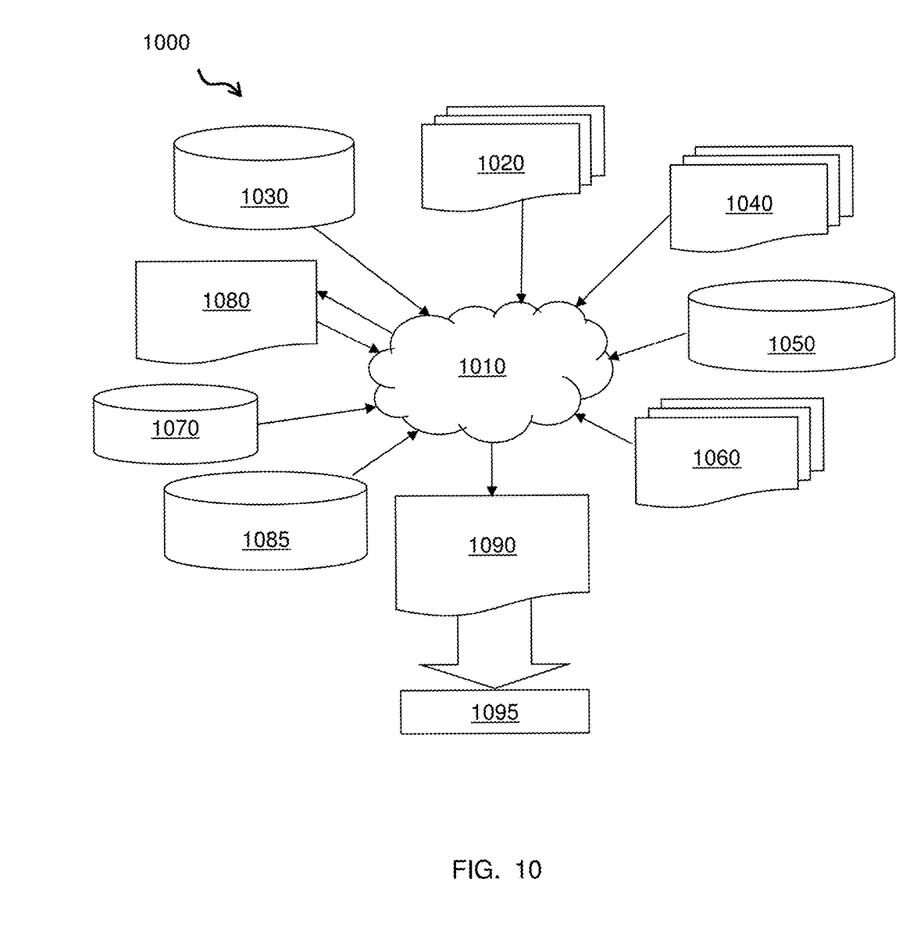
FIG. 10 is a block diagram illustrating an exemplary design flow used, for example, in the logic design, simulation, test, layout, and manufacture of the structures disclosed herein.

FIG. 10 shows a block diagram of an exemplary design flow 1000 used for example, in semiconductor IC logic design, simulation, test, layout, and manufacture. Design flow 1000 includes processes, machines, and/or mechanisms for processing design structures or devices to generate logically or otherwise functionally equivalent representations of the design structures and/or devices described above and shown in FIGS. 1-9. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 1-9. As such, design structure 1020 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 1-9 to generate a Netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which Netlist 1080 is resynthesized one or more times depending on design specifications and parameters for the device. As with other design structure types described herein, Netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including Netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 1090 may comprise a compiled, executable HDL simulation model that functionally simulates the devices shown in FIGS. 1-9.

Design structure 1090 may also employ a data format used for the exchange of layout data of integrated circuits and/or symbolic data format (e.g., information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 1090 may then proceed to a stage 1095 where, for example, design structure 1090: proceeds to tape-out, is released to manufacturing, is released to a mask house, is sent to another design house, is sent back to the customer, etc.

Aspects of the present disclosure are described herein with reference to flowchart illustrations and/or block diagrams of methods, apparatus (systems), and computer program products according to structures and methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 11:
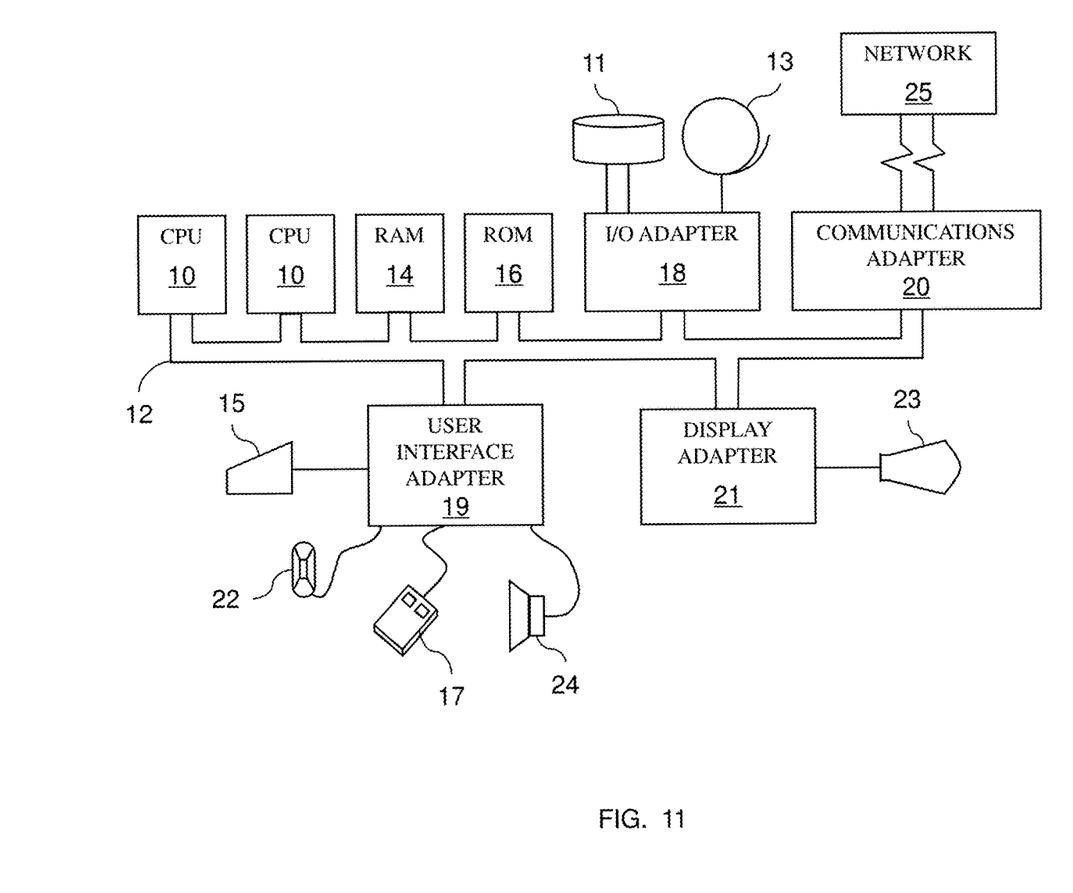
FIG. 11 is a schematic diagram illustrating an exemplary hardware system that can be used in the implementation of the design flow according to structures and methods herein.

A representative hardware environment for implementing the structures and methods herein is depicted in FIG. 11. This schematic drawing illustrates a hardware configuration of an information handling/computer system in accordance with the structures and methods herein. The system comprises at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow these instructions to execute the methodology of the structures and methods herein.

In FIG. 11, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various examples disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various structures and methods of the present disclosure have been presented for purposes of illustration, but are not intended to be exhaustive or limited to the structures and methods disclosed. Many modifications and variations will be apparent to those of ordinary skill in the art without departing from the scope and spirit of the described structures and methods. The terminology used herein was chosen to best explain the principles of the structures and methods, the practical application or technical improvement over technologies found in the marketplace, or to enable others of ordinary skill in the art to understand the structures and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the structures and methods herein, but that the structures and methods will include all features falling within the scope of the appended claims.

What is claimed is:

1. A device comprising:
   a digital-to-analog converter (DAC) comprising a plurality of complementary metal-oxide-semiconductor (CMOS) devices; and
   current sources connected to said CMOS devices,
      said current sources being arranged in an array, said current sources being uniformly spaced in said array using a golden ratio, wherein two quantities are in the golden ratio if their ratio is the same as the ratio of their sum to the larger of the two quantities.
2. The device according to claim 1, said array comprising a one-dimensional array.
3. The device according to claim 1, said current sources comprising current mirrors.

4. The device according to claim 1, said CMOS devices comprising a plurality of transistors.

5. A current source array comprising:
a plurality of current mirrors arranged in a row of an array, each current mirror of said plurality of current mirrors being uniformly spaced in said row using a golden ratio, wherein two quantities are in the golden ratio if their ratio is the same as the ratio of their sum to the larger of the two quantities.

6. The current source array according to claim 5, the outputs of said current mirrors each being connected to complementary metal-oxide-semiconductor (CMOS) devices.

7. The current source array according to claim 6, said CMOS devices comprising a plurality of transistors.

8. The current source array according to claim 7, said plurality of transistors comprising a digital-to-analog conversion circuit.

9. The current source array according to claim 5, said array comprising a one-dimensional array.

10. A computer implemented method comprising:
defining attributes for a current source for digital-to-analog converters (iDACs), using a computerized device;
identifying linearity performance constraints for said iDACs, using said computerized device;
determining placement of said iDACs in a current source array using a golden ratio, using said computerized device, wherein two quantities are in the golden ratio if their ratio is the same as the ratio of their sum to the larger of the two quantities;
calculating linearity performance parameters based on said placement, using said computerized device;
comparing said linearity performance parameters against predefined standards, using said computerized device; and
responsive to said linearity performance parameters not meeting said predefined standards, modifying said attributes for said iDACs and recalculating said linearity performance parameters based on said placement, using said computerized device.

11. The computer implemented method according to claim 10, said digital-to-analog converters comprising complementary metal-oxide-semiconductor (CMOS) devices, and
outputs of each said current source being connected to said CMOS devices.

12. The computer implemented method according to claim 11, said CMOS devices comprising a plurality of transistors.

13. The computer implemented method according to claim 10, said iDACs comprising current mirrors.

14. The computer implemented method according to claim 10, said linearity performance constraints comprising:
weighting factors based on different contribution between unary and binary elements.

15. The computer implemented method according to claim 10, said linearity performance parameters comprising:
differential nonlinearity (DNL) and integral nonlinearity (INL).

16. The computer implemented method according to claim 10, said current source array comprising a one-dimensional array.

17. The computer implemented method according to claim 10, further comprising:
defining a layout for an integrated circuit incorporating said iDACs, using said computerized device;
recalculating said linearity performance parameters based on said layout for said integrated circuit, using said computerized device; and
comparing the recalculated linearity performance parameters against said predefined standards, using said computerized device.

18. A layout method for a current source array, comprising:
arranging a plurality of complementary metal-oxide-semiconductor (CMOS) devices; and
arranging current sources for said CMOS devices uniformly in a row of an array, spacing between said current sources being determined using a golden ratio, wherein two quantities are in the golden ratio if their ratio is the same as the ratio of their sum to the larger of the two quantities.

19. The layout method according to claim 18, said CMOS devices comprising a plurality of transistors.

20. The layout method according to claim 19, said plurality of transistors comprising a digital-to-analog conversion circuit.

21. The layout method according to claim 18, said array comprising a one-dimensional array.

22. A computer program product comprising a non-transitory computer readable storage medium having program instructions embodied therewith, the program instructions being executed by a processor, to cause said processor to perform a method comprising:
defining attributes for a current source for digital-to-analog converters (iDACs);
identifying linearity performance constraints for said iDACs;
determining placement of said iDACs in a current source array on an integrated circuit chip using a golden ratio, wherein two quantities are in the golden ratio if their ratio is the same as the ratio of their sum to the larger of the two quantities;
calculating linearity performance parameters of said iDACs based on said placement;
comparing said linearity performance parameters calculated for said iDACs against predefined standards; and
responsive to said linearity performance parameters calculated for any of said iDACs not meeting said predefined standards, modifying said attributes for said iDACs and recalculating said linearity performance parameters based on said placement.

23. The computer program product according to claim 22, said method further comprising:
defining a layout for an integrated circuit incorporating said iDACs;
recalculating said linearity performance parameters based on said layout of said integrated circuit; and
comparing the recalculated linearity performance parameters against said predefined standards.

24. The computer program product according to claim 22, said linearity performance parameters comprising:
differential nonlinearity (DNL) and integral nonlinearity (INL).

25. The computer program product according to claim 22, said current source array comprising a one-dimensional array.

* * * * *